(12) United States Patent
Minzoni

(10) Patent No.: US 7,352,219 B2
(45) Date of Patent: Apr. 1, 2008

(54) DUTY CYCLE CORRECTOR

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 101 days.

(21) Appl. No.: 11/215,442

(22) Filed: Aug. 30, 2005

(65) Prior Publication Data

US 2007/0046351 A1 Mar. 1, 2007

(51) Int. Cl.
*H03K 3/017* (2006.01)
(52) U.S. Cl. ...................................... 327/175; 327/172
(58) Field of Classification Search ................. 327/175
See application file for complete search history.

(56) References Cited

U.S. PATENT DOCUMENTS

| | | | |
|---|---|---|---|
| 5,757,218 A | 5/1998 | Blum | |
| 5,945,857 A | 8/1999 | Havens | |
| 6,285,226 B1 | 9/2001 | Nguyen | |
| 6,426,660 B1 | 7/2002 | Ho et al. | |
| 6,578,154 B1 | 6/2003 | Wynen et al. | |
| 6,603,337 B2 | 8/2003 | Cho | |
| 6,788,120 B1 | 9/2004 | Nguyen | |
| 6,933,759 B1 | 8/2005 | Wu et al. | |
| 6,982,579 B2 * | 1/2006 | Lee ............................ | 327/158 |
| 2004/0090254 A1 * | 5/2004 | Owens et al. ................ | 327/170 |
| 2004/0222829 A1 * | 11/2004 | Cho et al. .................... | 327/156 |
| 2005/0122153 A1 * | 6/2005 | Lin ............................ | 327/291 |

* cited by examiner

*Primary Examiner*—Kenneth B. Wells
*Assistant Examiner*—Ryan C. Jager
(74) *Attorney, Agent, or Firm*—Dicke, Billig, Czaja PLLC

(57) ABSTRACT

A duty cycle corrector including a restore circuit configured to receive a differential input clock and a differential feedback clock each having crossings of a first type and a second type and to provide a differential output clock having crossing of the first type based on differential input clock crossings of the first type and crossings of the second type based on differential feedback clock crossings of the first type. A delay element configured to delay the differential output clock by a delay time to provide the differential feedback clock. An adjuster circuit configured to receive the differential input and feedback clocks and to adjust the delay time so as to maintain a duty cycle of the differential output clock substantially at a desired duty cycle.

18 Claims, 6 Drawing Sheets

DUTY CYCLE CORRECTOR

BACKGROUND

Many digital circuits receive a clock signal to operate. One type of circuit that receives a clock signal to operate is a memory circuit, such as a dynamic random access memory (DRAM), synchronous dynamic random access memory (SDRAM), or double data rate synchronous dynamic random access memory (DDR-SDRAM). In a memory circuit operating at high frequencies, it is important to have a clock signal that has about a 50% duty cycle. This provides the memory circuit with approximately an equal amount of time on the high level phase and on the low level phase for transferring data into and out of the memory circuit, such as latching rising edge data and latching falling edge data out of the memory circuit.

Often, a clock signal is provided by an oscillator, such as a crystal oscillator, and clock circuitry. The oscillator and clock circuitry may provide a clock signal that does not have a 50% duty cycle. For example, the clock signal may have a 45% duty cycle, where the high level phase is 45% of one clock cycle and the low level phase is the remaining 55% of the clock cycle. A duty cycle corrector receives the clock signal and corrects or changes the duty cycle of the clock signal to provide clock signals with transitions separated by substantially one half of a clock cycle.

One type of conventional duty cycle corrector generates an inverted reference clock from a reference clock using a pair of CMOS delay elements which are adjusted such that each is maintained substantially at one-half a clock cycle of the reference clock so that the inverted reference clock is maintained at 180 degrees out-of-phase with the reference clock. Two delay elements are required since rising and falling edge propagation delays of the reference clock through the delay elements are not equal. The reference and inverted reference clocks are used to generate an output clock have a 50% duty cycle.

While such conventional configurations are effective at providing duty cycle correction, the need for two delay elements consumes a large amount of integrated circuit space. Additionally, due to low chip operating voltages, noise on the chips, and the high operating frequencies of new standards, CMOS delay elements are not always an option as a delay element.

SUMMARY

One aspect of the present invention provides a duty cycle corrector including a restore circuit, a delay element, and an adjuster circuit. The restore circuit is configured to receive a differential input clock and a differential feedback clock each having crossings of a first type and a second type and to provide a differential output clock having crossing of the first type based on differential input clock crossings of the first type and crossings of the second type based on differential feedback clock crossings of the first type. The delay element is configured to delay the differential output clock by a delay time to provide the differential feedback clock. The adjuster circuit configured to receive the differential input and feedback clocks and to adjust the delay time so as to maintain a duty cycle of the differential output clock substantially at a desired duty cycle.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description.

The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
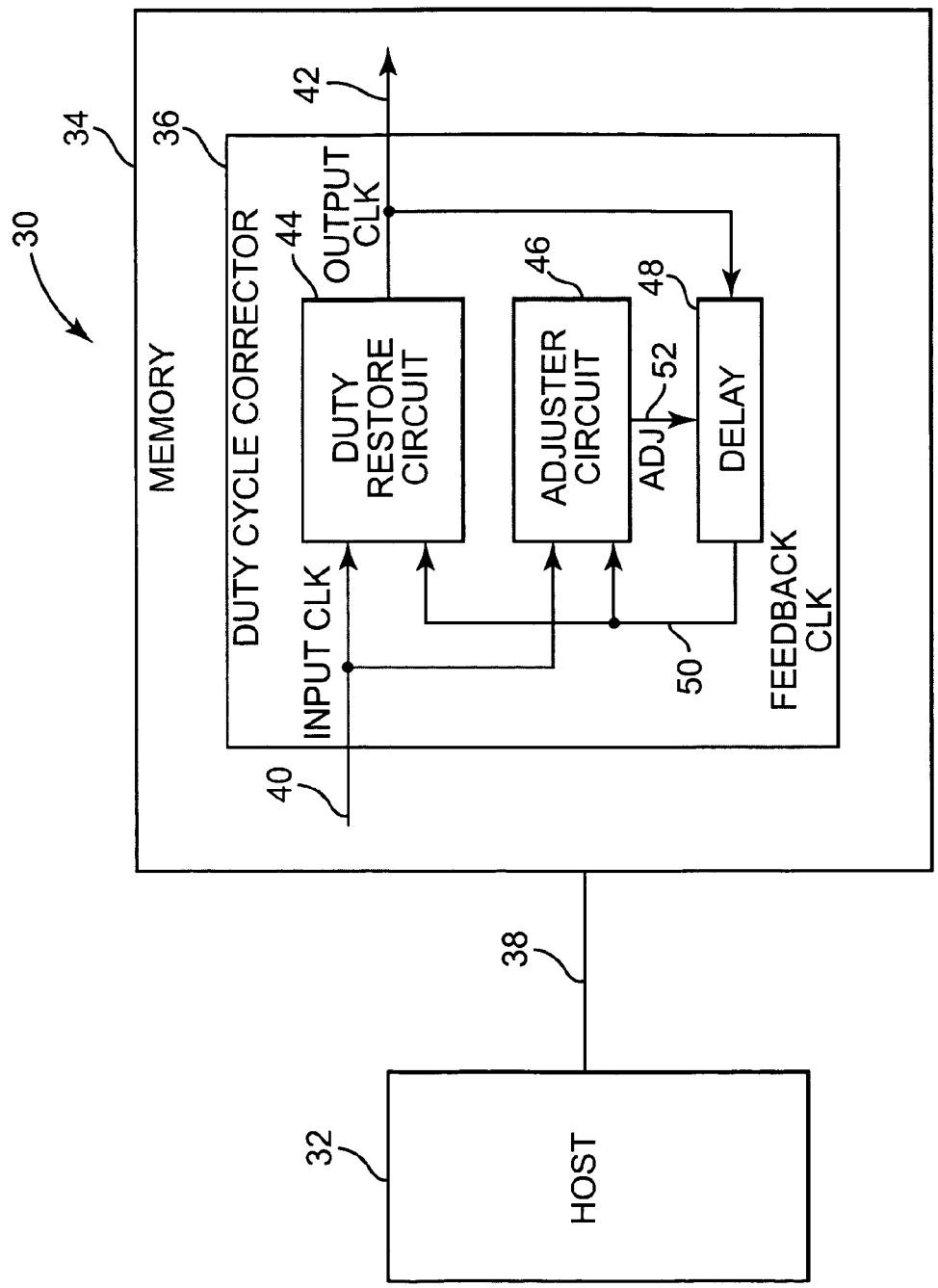
FIG. 1 is a block diagram illustrating one embodiment of a memory circuit employing a duty cycle corrector according to the present invention.

FIG. 1 is a block diagram illustrating one embodiment of an electronic system 30 including a host device 32 and a memory circuit 34 employing a duty cycle corrector (DCC) 36 in accordance with the present invention. Host device 32 is coupled to memory 34 via a communications path 38. Host device 32 can be any suitable electronic device such as a computer system including a microprocessor or a microcontroller. Memory circuit 34 can be any suitable memory that utilizes a clock signal to operate. In one embodiment, memory circuit 34 comprises a random access memory, such as a dynamic random access memory (DRAM), synchronous dynamic random access memory (SDRAM), or double data rate synchronous dynamic random access memory (DDR-SDRAM).

DCC 36 receives a differential input clock, which may not have a 50% duty cycle, via a signal path 40 and provides a differential output clock having a duty cycle substantially equal to a desired duty cycle via a signal path 42. In one embodiment, DCC 36 receives the differential input clock via signal path 40 from host device 32 via communications path 38. In other embodiments, DCC 36 receives the differential input clock via signal path 40 from any suitable device, such as a dedicated clock circuit that may be situated internal to or external to memory circuit 34. The differential output clock on signal path 42 is employed by memory device 34 to clock data to/from external devices, such as host 32. In one embodiment, the desired duty cycle is a 50% duty cycle. Maintaining the differential output clock at a duty cycle of 50% provides memory circuit 34 with approximately an equal amount of time on the high level phase and low level phase of the output clock to transfer data.

DCC 36 includes a duty restore circuit (DRC) 44, an adjuster circuit 46, and a delay element 48. DRC 44 receives the differential input clock via signal path 40 and a differential feedback clock via a signal path 50, with the differential input clock having crossings of at least a first type and the differential feedback clock having crossings of the first type and a second type. DRC 44 provides the differential output clock via signal path 42 with the differential output clock having crossings of the first type based on input clock crossings of the first type and having crossings of the second type based on differential feedback clock crossings of the first type.

Delay element 48 receives the differential output clock via signal path 42 and delays the differential output clock by a delay time (δ) to provide the differential feedback clock via signal path 50. Adjuster circuit 46 receives the differential input clock via signal path 40 and the differential feedback clock via signal path 50. Adjuster circuit 46 compares the differential feedback clock to the differential input clock and provides an adjustment signal (ADJ) to delay element 48 via a signal path 52 to adjust the delay time (δ) based on a time difference between differential input clock crossings of the first type and differential feedback clock crossings of the second type such that a duty cycle of the differential output clock at signal path 42 is substantially equal to a desired duty cycle.

In one embodiment, the differential input, and feedback clocks each comprise a clock signal and an inverted clock signal, wherein the first type of crossings comprise crossings of the clock signal and inverted clock signal as the clock signal transitions from a logic "LO" to a logic "HI" and the inverted clock signal transitions from a logic "HI" to a logic "LO", and the second type of crossings comprise crossings of the clock signal and inverted signal as the clock signal transitions from HI to logic LO and the inverted clock signal transitions from LO to HI. In one embodiment, adjuster circuit 46 adjusts delay time (δ) of delay element 48 such that the crossing points of the differential input clock as the clock signal transitions from LO to HI and the inverted clock transitions from HI to LO are substantially aligned with the crossing points of the differential feedback clock as the clock signal transitions from HI to LO and the inverted clock signal transitions from LO to HI, thereby causing the clock signal and inverted clock signal of the differential output clock to have a duty cycle substantially equal to a 50% duty cycle.

By adjusting the differential feedback clock based on comparing the crossing points of the differential feedback and input clocks and including duty restore circuit 44 as part of a feedback loop in this fashion, duty cycle corrector 36 requires only a single delay element, thereby requiring less space on an integrated circuit (IC) than conventional duty cycle correctors. Additionally, by employing a differential amplifier-based delay element, a duty cycle corrector according to the present invention is better suited to the lower chip operating voltage and higher operating frequencies and less susceptible to noise than conventional duty cycle correctors. Furthermore, by basing time delay adjustments on phase differences crossing points of the differential feedback and reference clocks, a duty cycle corrector according to the present invention is less susceptible to potential voltage distortions of reference clock which can adversely affect detection of clock transitions in conventional duty cycle correctors.

Figure 2:
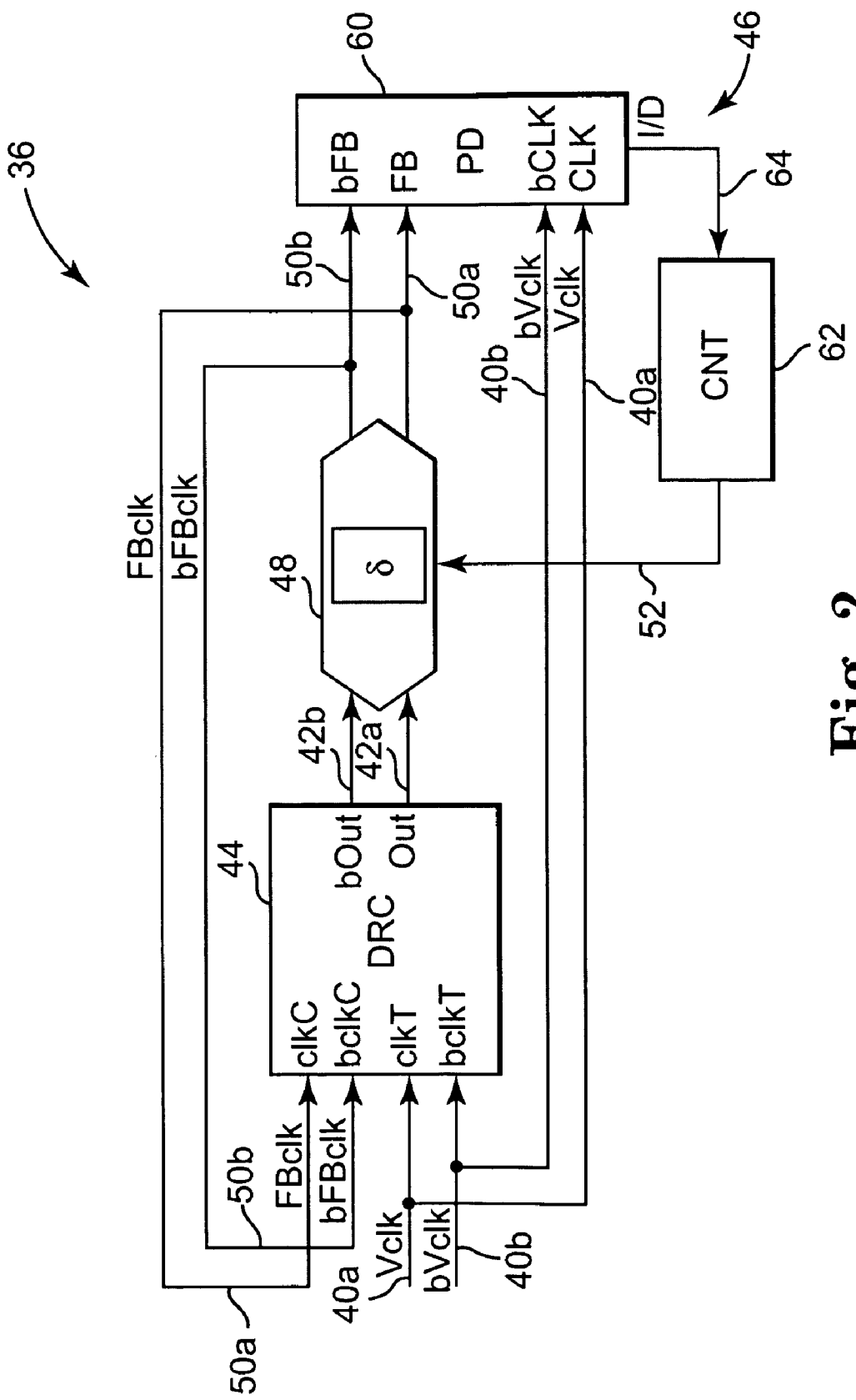
FIG. 2 is a block and schematic diagram illustrating one embodiment of a duty cycle corrector according to the present invention.

FIG. 2 is a block and schematic diagram illustrating one example embodiment of duty cycle corrector 36 according to the present invention. Duty cycle corrector 36 includes DRC 44, adjuster circuit 46, and delay element 48, with adjuster circuit 46 comprising a phase detector (PD) 60 and a counter (CNT) 62. In the illustrated embodiment, the input, output, and feedback clocks are differential clocks, with the differential input clock comprising an input clock signal (Vclk) and an inverted input clock signal (bVclk), the differential output clock comprising an output clock signal (Out) and an inverted output clock signal (bOut), and the differential feedback clock comprising a feedback clock signal (FBclk) and an inverted feedback clock signal (bFBclk). Also, as illustrated, signal path 40 comprises a pair of signal paths 40a, 40b, signal path 42 comprises a pair of signal paths 42a, 42b, and signal path 50 comprises a pair of signal paths 50a, 50b.

DRC 44 receives Vclk at input clkT via signal path 40a and bVclk at input bclkT via signal path 40b, and receives FBclk at input clkC via signal path 50a and bFBclk at input bclkC via signal path 50b. DRC 44 respectively provides Out and bOut via signal paths 42a and 42b based on the rising/falling crossing points of Vclk/bVclk and FBclk/bFBclk. In one embodiment, as will be described in further detail below by FIGS. 3A and 3B, DRC provides the rising/falling crossing points of Out/bOut based on the rising/falling crossing points of Vclk/bVclk and the falling/rising crossing points of Out/bOut on the rising/falling crossing points of FBclk/bFBclk. The term "rising" refers to a transition from a logic LO to a logic HI and the term "falling" refers to a transition from a logic HI to a logic "Lo." Delay element 48 delays Out and bOut by a delay time (δ) to respectively provide FBclk and bFBclk via signal paths 50a and 50b.

Phase detector 60 receives Vclk at input CLK via signal path 40a and bVclk at input bCLK via signal path 40b, and receives FBclk at input FB via signal path 50a and bFBclk at input bFB via signal path 50b. In one embodiment, as will be described in further detail below by FIGS. 3A and 3B, PD 60 provides and increment/decrement signal (I/D) via a signal path 64 to CNT 62 based on a comparison of the rising/falling crossing points of Vclk/bVclk to the falling/rising crossing points of FBclk/dFBclk.

Based on the I/D signal, CNT provides ADJ via signal path 52 to adjust time delay (δ) of delay element 48 so that the falling/rising crossing points of FBclk/dFBclk is substantially aligned with the rising/falling crossing points of Vclk/bVclk, thereby resulting in Out and bOut having 50% duty cycles. In one embodiment, delay element 48 provides one of a plurality of discrete delay time values based on the value of ADJ received from CNT 62. As such, in one embodiment, CNT 62 serves as a reference pointer for delay element 48.

Figures 3A, 3B:
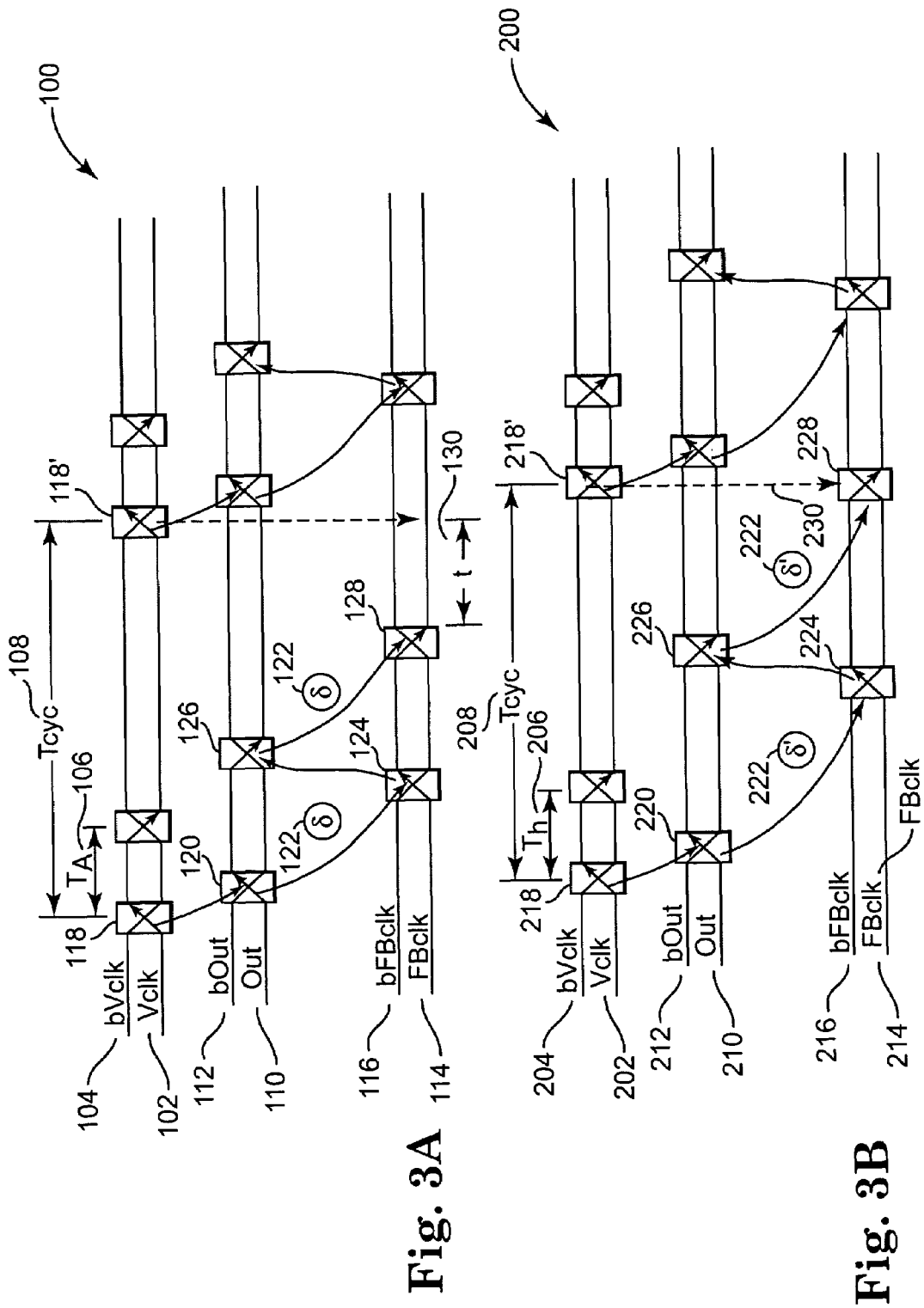
FIG. 3A is a timing diagram illustrating an example of the operation of the duty cycle corrector of FIG. 2.
FIG. 3B is a timing diagram illustrating an example of the operation of the duty cycle corrector of FIG. 2.

FIGS. 3A and 3B are example timing diagrams illustrating the operation of DCC 36 illustrated by FIG. 2 when the differential input clock (i.e. reference clock), represented by Vclk and bVclk on signal paths 40a and 40b, has a less than 50% duty cycle. The description of FIGS. 3A and 3B is made with reference to FIG. 2.

FIG. 3A is a timing diagram 100 illustrating an example initial operating condition of DCC 36 prior to adjustment of delay time (δ) of delay element 48. The differential input clock is represented by Vclk and bVclk, which are respectively illustrated by waveforms 102 and 104. As illustrated, the duty cycle of the differential input clock is less than 50%, with the high time (Th) 106 of Vclk being less than half the total cycle time (Tcyc) 108. The differential output clock is represented by Out and bOut on signal paths 42a and 42b, which are respectively illustrated by waveforms 110 and 112. The differential feedback clock is represented by FBclk and dFBclk, which are respectively illustrated by waveforms 114 and 116. Since delay time (δ) of delay element 48 has not yet been adjusted, the duty cycle of the differential output and differential feedback clocks are also less than 50%.

Initially, in response to the rising/falling Vclk/bVclk crossing point 118, DRC 44 generates the rising/falling Out/bOut crossing point 120. Delay element 48 delays the differential output clock by an initial delay time (δ), as indicated at 122, to provide the rising/falling FBclk/dFBclk crossing point 124. In response to rising/falling FBclk/dFBclk crossing point 124, DRC 44 generates the falling/rising Out/bOut crossing point 126 of the differential output clock. Once again, delay element 48 delays the differential output clock by the initial delay time (δ) 122, and provides the falling/rising FBclk/dFBclk crossing point 128.

PD 60 subsequently compares a next rising/falling Vclk/bVclk crossing point 118' of the differential input clock to falling/rising FBclk/dFBclk crossing point 128 of the differential feedback clock. Initially, as illustrated, falling/rising FBclk/dFBclk crossing point 128 lags rising/falling Vclk/bVclk crossing point 118' by a time (t) 130. In response, PD 60 provides I/D signal to CNT 62 via signal path 64 having a value indicating an increment (i.e. increase delay time (δ)). CNT 62 provides an ADJ signal having a coded value based on the value of the I/D signal to delay element 48 via signal path 52 which, in-turn, is translated to a desired adjusted delay time (δ') by delay element 48.

FIG. 3B is a timing diagram 200 illustrating an example final, or stable, operating condition of DCC 36 after adjustment of the delay time (δ) to desired adjusted delay time (δ') by delay element 48. Similar to that described above by FIG. 3A, in response to rising/falling Vclk/bVclk crossing point 218, DRC 44 generates rising/falling Out/bOut crossing point 220. Delay element 48 delays the differential output clock by desired adjusted delay time (δ'), as indicated at 222, to provide rising/falling FBclk/dFBclk crossing point 224. In response to rising/falling FBclk/dFBclk crossing point 224, DRC 44 generates falling/rising Out/bOut crossing point 226 of the differential output clock. Once again, delay element 48 delays the differential output clock by the desired adjusted delay time (δ') 222, and provides falling/rising FBclk/dFBclk crossing point 228.

PD 60 subsequently compares the next rising/falling Vclk/bVclk crossing point 218' of the differential input clock to falling/rising FBclk/dFBclk crossing point 228 of the differential feedback clock. As illustrated, after adjusting the delay time (δ) of delay element 48 to the desired adjusted delay time (δ'), the next rising/falling Vclk/bVclk crossing point 218' is substantially aligned with falling/rising FBclk/dFBclk crossing point 228, as indicated by the dashed line 230. As a result, the differential output clock (Out/bOut) and differential feedback clock (FBclk/dFBclk) each have duty cycles substantially equal to 50%. Differential output clock signals Out and bOut may then be employed by a circuit, such as memory circuit 34 of FIG. 1, to provide an equal amount of time on the high level phase and the low level phase for transferring data to/from the memory circuit to another device, such as host device 32.

Figure 4:
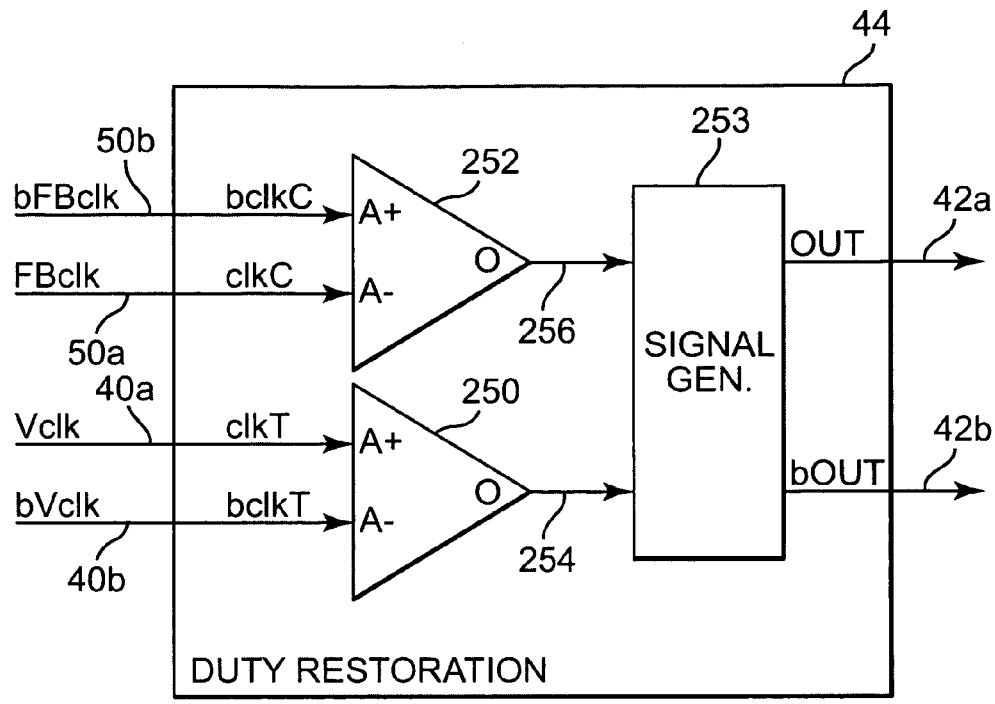
FIG. 4 is a block and schematic diagram illustrating one embodiment of a duty restoration circuit employed by a duty cycle correction according to the present invention.

FIG. 4 is a block and schematic diagram illustrating one example embodiment of DRC 44 according to the present invention. DRC 44 includes an input operational amplifier 250, a feedback operational amplifier 252, and a signal generator 253, with input and feedback operational amplifiers 250 and 252 being configured as comparators. Input operational amplifier 250 receives Vclk at a non-inverting input (A+) via signal path 40a and bVclk at an inverting input (A−) via signal path 40b. Feedback operational amplifier 252 receives FBclk at an inverting input (A−) via signal path 50a and bFBclk at a non-inverting input (A+) via signal path 50b.

Input operational amplifier 250 compares the voltage level of Vclk at (A+) to the voltage level of bVclk at (A−) and provides via signal path 254 at an output (O) an output signal having a logic HI when the voltage level of Vclk is greater than the voltage level of bVclk and a logic LO when the voltage level of bVclk is greater than the voltage level of Vclk. Similarly, feedback operational amplifier 252 compares the voltage level of FBclk at (A−) to the voltage level of bFBclk at (A+) and provides via signal path 256 at an output (O) an output signal having a logic LO when the voltage level of FBclk is greater than the voltage level of bFBclk and a logic HI when the voltage level of bFBclk is greater than the voltage level of FBclk.

Signal generator 253 respectively receives the output signals from input and feedback operational amplifiers 250 and 252 via signal paths 254 and 256. When the output of input operational amplifier 250 transitions from logic LO to logic HI, signal generator 253 causes Out on signal path 42a to transition from a logic LO to a logic HI and bOut on signal path 42b to transition from a logic HI to a logic LO (such as illustrated by rising/falling crossing points 118 and 120 of Vclk/bVclk and Out/bOut of FIG. 3A). When the output of feedback operational amplifier 252 transitions from logic HI to logic LO, signal generator 253 cause Out on signal path 42a to transition from a logic HI to a logic LO and bOut to transitions for a logic LO to a logic HI (such as illustrated by rising/falling FBclk/bFBclk crossing point 124 and falling/rising Out/bOut crossing point 126 of FIG. 3A).

Figure 5:
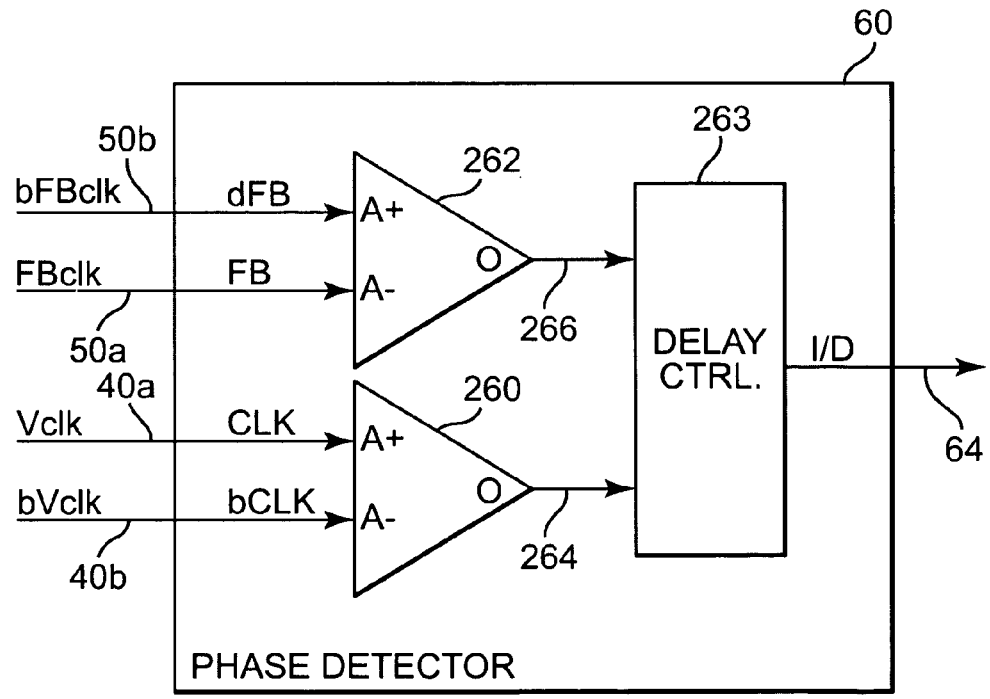
FIG. 5 is a block and schematic diagram illustrating one embodiment of a phase detector employed by a duty cycle correction according to the present invention.

FIG. 5 is a block and schematic diagram illustrating one example embodiment of PD 60 according to the present invention. PD 60 includes an input operational amplifier 260, a feedback operational amplifier 262, and a delay controller 263, with input and feedback operational amplifiers 260 and 262 being configured as comparators. Input operational amplifier 260 receives Vclk at a non-inverting input (A+) via signal path 40a and bVclk at an inverting input (A−) via signal path 40b. Feedback operational amplifier 262 receives FBclk at an inverting input (A−) via signal path 50a and bFBclk at a non-inverting input (A+) via signal path 50b.

Input operational amplifier 260 compares the voltage level of Vclk at (A+) to the voltage level of bVclk at (A−)

and provides via signal path 264 at an output (O) an output signal having a logic HI when the voltage level of Vclk is greater than the voltage level of bVclk and a logic LO when the voltage level of bVclk is greater than the voltage level of Vclk. Similarly, feedback operational amplifier 262 compares the voltage level of FBclk at (A−) to the voltage level of bFBclk at (A+) and provides via signal path 256 at an output (O) an output signal having a logic LO when the voltage level of FBclk is greater than the voltage level of bFBclk and a logic HI when the voltage level of bFBclk is greater than the voltage level of FBclk.

Delay controller 263 monitors the output signals respectively received from input and feedback operational amplifiers 260 and 262 via signal paths 264 and 266. Delay controller 263 determines a time difference (Δt) between when the outputs on signal paths 264 and 266 of input and feedback amplifiers 260 and 262 transition from a logic LO to a logic HI, and provides the I/D signal on signal path 64 having a value based on Δt. In one embodiment, when Δt is greater than zero, delay controller 263 provides I/D on signal path 64 having a value that increments CNT 62, thereby resulting in an increase in the time delay (δ) provided by delay element 48 (as illustrated with regard to FIGS. 3A and 3B). Conversely, when Δt is less than zero, delay controller 263 provides I/D on signal path 64 having a value that decrements CNT 62, thereby resulting in a decrease in the time delay (δ) provided by delay element 48. In one embodiment, when Δt is within a predetermined range (+/−) of zero, delay controller 263 provides I/D on signal path 64 that causes CNT 62 to maintain a present value, thereby resulting delay element 48 maintaining a given delay time (δ).

In the embodiment of DCC 36 illustrated by FIG. 2, the generation of the differential feedback clock (FBclk/bFBclk) by DRC 44 may create a potential mismatch between the slew-rates of the differential feedback clock and the differential input (reference) clock (Vclk/bVclk). Such a slew-rate mismatch may produce inaccuracies in PD 60 by affecting the output of input and feedback operational amplifiers 260 and 262 (see FIG. 5).

Figure 6:
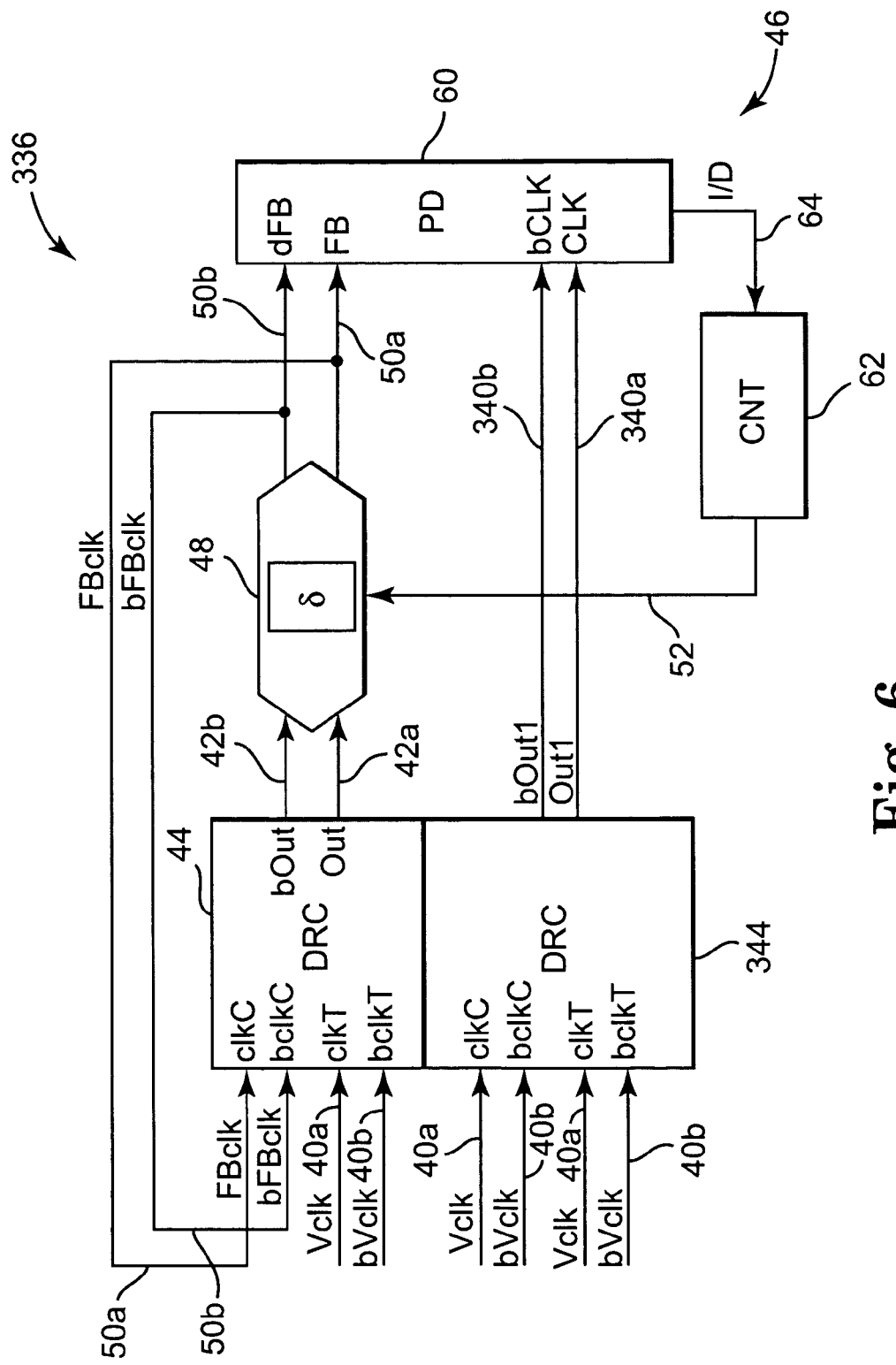
FIG. 6 is a block and schematic diagram illustrating one embodiment of a duty cycle corrector according to the present invention.

FIG. 6 is a block and schematic diagram illustrating one embodiment of a DCC 336 according to the present invention to reduce the potential for slew-rate mismatches. DCC 336 includes similar components to DCC 36 of FIG. 2, with the exception of additional DRC 344. DRC 344 receives Vclk at input clkT via signal path 40a and bVclk at input bclkT via signal path 40b, and receives Vclk at input clkC via signal path 40a and bVclk at input bclkC via signal path 40b. DRC 344 provides Out1 and bOut1 via signal paths 340a and 340b based on the rising/falling and falling/rising crossing points of Vclk/bVclk. As will be described in greater detail below by FIG. 7, in one embodiment, DRC 344 provides rising/falling crossing points of Out1/bOut1 based on the rising/falling crossing points of Vclk/bVclk received via inputs clkT/bclkT, and the falling/rising crossing points of Out1/bOut1 based on the falling/rising crossing points of Vclk/bVclk received via inputs clkC and bclkC. Essentially, Out1 and bOut1 represent a duty-restored version of the differential input clock (Vclk/bVclk) as generated by DRC 344.

PD 60 respectively receives Out1/bOut1 at inputs CLK/bCLK via signal paths 340a and 340b. In one embodiment, as will be described in greater detail below by FIG. 7, PD 60 provides the I/D signal on signal path 64 based on comparing the rising/falling crossing points of Out1/bOut1 to the falling/rising crossing points of FBclk/dFBclk received at inputs FB/bFB via signal paths 50a and 50b. Since FBclk/bFBclk and Out1/bOut1 are respectively generated by DRCs 44 and 344, there is less likelihood of a slew-rate mismatch to adversely affect the accuracy of the time difference (Δt) determined by PD 60.

Figure 7:
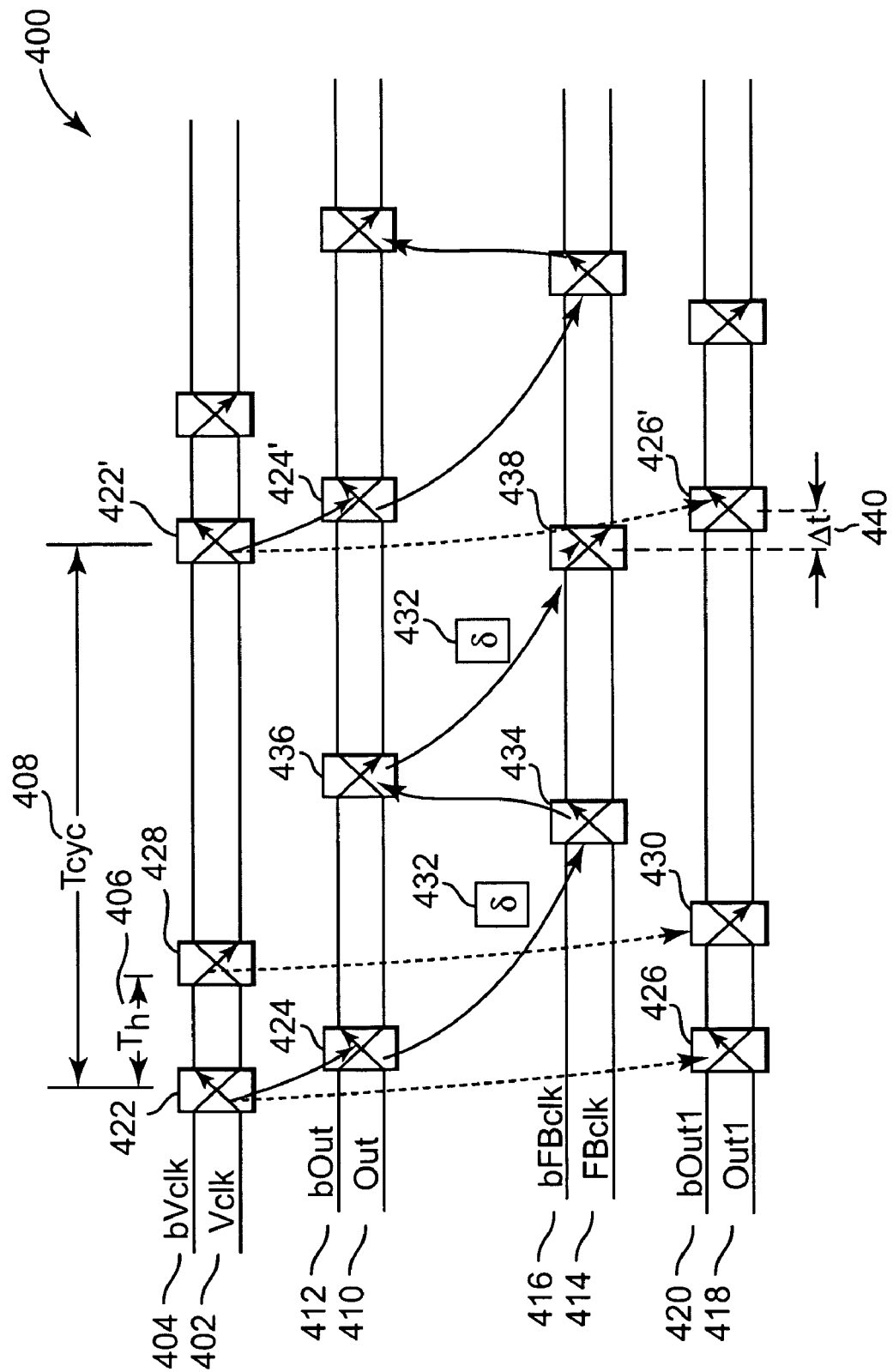
FIG. 7 is a timing diagram illustrating an example of the operation of the duty cycle corrector of FIG. 6.

FIG. 7 is a timing diagram 400 illustrating an example stable, or final, operation of DCC 336 of FIG. 6, after the delay time (δ) of delay element 48 has been adjusted so that the duty cycle of differential output clock Out/bOut1 is substantially equal to 50%. The differential input clock is represented by Vclk/bVclk on signal paths 40a and 40b, which are respectively illustrated by waveforms 402 and 404. As illustrated, the duty cycle of the differential input clock is less than 50%, with the high time (Th) 406 of Vclk being less than half the to total cycle time (Tcyc) 408. The differential output clock is represented by Out/bOut on signal paths 42a and 42b, which are respectively illustrated by waveforms 110 and 112. The differential feedback clock is represented by FBclk and dFBclk, which are respectively illustrated by waveforms 414 and 416. The duty restored version of differential input clock is represented by Out1 and bOut1 on signal paths 340a and 340, which are respectively illustrated by waveforms 418 and 420.

Initially, in response to the rising/falling Vclk/bVclk crossing point 422, DRC 44 generates the rising/falling Out/bOut crossing point 424 and DRC 344 generates the rising/falling Out1/bOut1 crossing point 426. In response to the falling/rising Vclk/bVclk crossing point 428, DRC 344 generates the falling/rising Out1/bOut1 crossing point 430. Delay element 48 delays the differential output clock Out/bOut by a delay time (δ), as indicated at 432, to provide the rising/falling FBclk/dFBclk crossing point 434.

In response to rising/falling FBclk/dFBclk crossing point 434, DRC 44 generates the falling/rising Out/bOut crossing point 436 of the differential output clock. Once again, delay element 48 delays the differential output clock by the delay time (δ) 432 so as to provide the falling/rising FBclk/dFBclk crossing point 438. In response to a next rising/falling Vclk/bVclk crossing point 422', DRC 44 generates a next rising/falling Out/bOut crossing point 424' and DRC 344 generates a next rising/falling Out1/bOut1 crossing point 426'.

PD 60 subsequently compares the rising/falling crossing point 426' of the duty-restored differential input clock Out1/bOut1 to the falling/rising FBclk/dFBclk crossing point 128 of the differential feedback clock to determine a phase difference (Δt) 440. As illustrated, when delay time (δ) 432 has a value such that differential output clock Out/bOut has a duty cycle of 50%, phase difference (Δt) 440 will have a value substantially equal to a propagation delay ($t_{DC}$) through DRC 344. If Δt 440 is greater than $t_{DC}$, PD provide I/D signal to CNT 62 via signal path 64 having a value indicating an increment (i.e. increase delay time (δ)). If Δt 440 is less than $t_{DC}$, PD provide I/D signal to CNT 62 via signal path 64 having a value indicating an decrement (i.e. decrease delay time (δ)).

Although specific embodiments have been illustrated and described herein, it will be appreciated by those of ordinary skill in the art that a variety of alternate and/or equivalent implementations may be substituted for the specific embodiments shown and described without departing from the scope of the present invention. Thus, this application is intended to cover any adaptations or variations of the specific embodiments discussed herein. Therefore, it is intended that this invention be limited only by the claims and the equivalents thereof.

What is claimed is:

1. A duty cycle corrector comprising:
a restore circuit configured to receive a differential input clock and a differential feedback clock each having crossings of a first type and a second type and to provide a differential output clock having crossing of the first type based on differential input clock crossings of the first type and crossings of the second type based on differential feedback clock crossings of the first type;
a delay element configured to delay the differential output clock by a delay time to provide the differential feedback clock; and
an adjuster circuit configured to receive the differential input and differential feedback clocks and to adjust the delay time so as to maintain a duty cycle of the differential output clock substantially at a desired duty cycle; and
wherein the restore circuit comprises:
a first operational amplifier receiving the differential input clock and providing a first output having a first state in response to differential input clock crossings of the first type and having a second state in response to differential input clock crossings of the second type;
a second operational amplifier receiving the differential feedback clock and providing a second output having the first state in response to differential feedback crossings of the second type and having the second state in response to differential feedback crossings of the first type; and
a signal generator providing the differential output clock based on the states of the first and second outputs.

2. The duty cycle corrector of claim 1, wherein the adjuster circuit adjusts the delay time so as to align differential feedback clock crossings of the second type with differential input clock crossings of the first type.

3. The duty cycle corrector of claim 1, wherein the desired duty cycle is a fifty percent duty cycle.

4. The duty cycle corrector of claim 1, wherein the delay element comprises a differential amplifier-based delay element.

5. The duty cycle corrector of claim 1, wherein the differential input, feedback, and output clocks each comprise a clock signal and an inverted clock signal, and wherein the first type of crossing comprises a transition of the clock signal from the first state to the second state and the inverted clock signal from the second state to the first state and the second type of crossing comprises a transition of the clock signal from the second state to the first state and the inverted clock signal from the first state to the second state.

6. The duty cycle corrector of claim 5, wherein the first state comprises a low state and the second state comprises a high state.

7. The duty cycle corrector of claim 1, wherein the signal generator provides differential clock crossings of the first type in response to the first output transitioning from the second state to the first state and differential output clock crossings of the second type in response to the second output transitioning from the second state to the first state.

8. The duty cycle corrector of claim 1, wherein the adjuster circuit comprises:
a phase detector configured to determine a phase difference between differential input crossings of the first type and differential feedback crossings of the second type and to provide a control signal having a value based on based on the phase difference; and
a counter configured to adjust the delay time of the delay element based on the control signal value.

9. A duty cycle corrector comprising:
a restore circuit configured to receive a differential input clock and a differential feedback clock each having crossings of a first type and a second type and to provide a differential output clock having crossing of the first type based on differential input clock crossings of the first type and crossings of the second type based on differential feedback clock crossings of the first type;
a delay element configured to delay the differential output clock by a delay time to provide the differential feedback clock; and
an adjuster circuit configured to receive the differential input and differential feedback clocks and to adjust the delay time so as to maintain a duty cycle of the differential output clock substantially at a desired duty cycle;
wherein the adjuster circuit comprises:
a phase detector configured to determine a phase difference between differential input crossings of the first type and differential feedback crossings of the second type and to provide a control signal having a value based on based on the phase difference; and
a counter configured to adjust the delay time of the delay element based on the control signal value; and
wherein the phase detector comprises:
a first operational amplifier receiving the differential input clock and providing a first output having a first state in response to differential input clock crossings of the first type and having a second state in response to differential input clock crossings of the second type;
a second operational amplifier receiving the differential feedback clock and providing a second output having the first state in response to differential feedback crossings of the second type and having the second state in response to differential feedback crossings of the first type; and
a signal generator providing the control signal having a value based a time difference the first output transitioning from the second state to the first state and the second output transitioning from the second state to the first state.

10. The duty cycle corrector of claim 9, wherein the control signal having a value indicating an increase in the delay time when second output transitions from the second state to the first state prior to the first output and a value indicating a decrease in the delay time when the first output transitions from the second state to the first state prior to the second output.

11. A duty cycle corrector comprising:
a first restore circuit configured to receive a differential input clock and a differential feedback clock each having crossings of a first type and a second type and to provide a differential output clock having crossings of the first type based on differential input clock crossings of the first type and crossings of the second type based on differential feedback clock crossings of the first type;
a delay element configured to delay the differential output clock by a delay time to provide the differential feedback clock;

a second restore circuit configured to receive the differential input clock and to provide a restored input clock having crossing of the first type based on differential input clock crossings of the first type and crossings of the second type based on differential input clock crossings of the second type;

an adjuster circuit configured to adjust the delay time so as to maintain a duty cycle of the differential output clock substantially at a desired duty cycle.

12. The duty cycle corrector of claim 11, wherein the adjuster circuit adjusts the delay time based on a time difference between differential feedback clock crossings of the second type and restored input clock crossings of the first type.

13. The duty cycle corrector of claim 11, wherein the adjuster circuit adjusts the delay time so as to maintain a phase difference between differential feedback clock crossings of the second type with differential input clock crossings of the first type substantially at a desired phase difference.

14. The duty cycle corrector of claim 13, wherein the desired phase difference is substantially equal to a propagation delay of the second restore circuit.

15. The duty cycle corrector of claim 11, wherein the desired duty cycle is a fifty percent duty cycle.

16. A memory circuit comprising:

a memory;

a first restore circuit configured to receive a differential input clock and a differential feedback clock each having crossings of a first type and crossings of a second type and to provide a differential output clock having crossing of the first type based on differential input clock crossings of the first type and crossings of the second type based on differential feedback clock crossings of the first type;

a second restore circuit configured to receive the differential input clock and to provide a restored input clock having crossings of the first type based on differential input clock crossings of the first type and crossings of the second type based on differential input clock crossings of the second type;

a delay element configured to delay the differential output clock by a delay time to provide the differential feedback clock; and an adjuster circuit configured to receive the restored input and differential feedback clocks and to adjust the delay time based on a phase difference between restored input clock crossings of the first type and differential feedback clock crossing of the second type so as to maintain a duty cycle of the differential output clock substantially at a fifty percent duty cycle, wherein the adjuster circuit adjusts the delay time so as to substantially align differential feedback crossings of the second type with differential input clock crossings of the first type.

17. The memory circuit of claim 16, wherein the delay element comprises an operational amplifier-type delay element configured to delay crossings of the first type and crossings of the second type of the differential output clock by substantially a same amount.

18. The memory circuit of claim 16, wherein the adjuster circuit adjusts the delay time so as to maintain a phase difference between differential feedback crossings of the second type and restored input clock crossings of the first type substantially equal to a propagation delay of the second restore circuit.

* * * * *